United States Patent
Bourbiaux et al.

(10) Patent No.: US 10,669,818 B2
(45) Date of Patent: Jun. 2, 2020

(54) METHOD FOR OPERATING A HYDROCARBON DEPOSIT BY INJECTION OF A GAS IN FOAM FORM

(71) Applicant: IFP Energies nouvelles, Rueil-Malmaison (FR)

(72) Inventors: Bernard Bourbiaux, Rueil-Malmaison (FR); Christophe Preux, Acheres (FR); Lahcen Nabzar, Rueil-Malmaison (FR); Benjamin Braconnier, Antony (FR)

(73) Assignee: IFP Energies nouvelles, Rueil-Malmaison (FR)

( * ) Notice: Subject to any disclaimer, the term of this patent is extended or adjusted under 35 U.S.C. 154(b) by 330 days.

(21) Appl. No.: 15/663,959

(22) Filed: Jul. 31, 2017

(65) Prior Publication Data
US 2018/0030817 A1    Feb. 1, 2018

(30) Foreign Application Priority Data
Jul. 29, 2016 (FR) ...................... 16 57393

(51) Int. Cl.
| | |
|---|---|
| *E21B 43/16* | (2006.01) |
| *E21B 41/00* | (2006.01) |
| *G06F 30/20* | (2020.01) |
| *E21B 49/00* | (2006.01) |
| *B29C 45/00* | (2006.01) |
| *B29C 65/00* | (2006.01) |

(52) U.S. Cl.
CPC .......... *E21B 41/0092* (2013.01); *E21B 41/00* (2013.01); *E21B 43/166* (2013.01);
(Continued)

(58) Field of Classification Search
None
See application file for complete search history.

(56) References Cited

U.S. PATENT DOCUMENTS

| | | | | |
|---|---|---|---|---|
| 3,937,283 | A * | 2/1976 | Blauer | .................. C09K 8/703 |
| | | | | 166/307 |
| 2009/0150097 | A1 * | 6/2009 | Camilleri | .................. G01P 5/00 |
| | | | | 702/45 |

(Continued)

OTHER PUBLICATIONS

K. Ma, Jose L., Lopez-Salinas, M. C. Puerto, C. A. Miller, S. L. Biswal, and G. J. Hirasaki, "Estimation of Parameters for the Simulation of Foam flow through Porous Media, Part 1: The Dry-Out Effect" 2013, pp. 2363-2375 (Year: 2013).*

(Continued)

*Primary Examiner* — Kibrom K Gebresilassie
(74) *Attorney, Agent, or Firm* — Fitch, Even, Tabin & Flannery LLP

(57) ABSTRACT

The invention is a method for operating a hydrocarbon deposit by injection of gas in foam form, comprising determining a model of displacement of the foam which is a function of an optimal mobility reduction factor of the gas and at least one interpolation function dependent on a parameter and constants to be calibrated. The mobility reduction factor of the gas is determined and the constants of at least one interpolation function are calibrated from experimental measurements comprising injections of gas in non-foaming form and in foam form into a sample of the deposit for different values of the parameter relative to the function being considered. Measurements of headloss corresponding to each value of the parameter of the interpolation function are considered. The calibration of the constants is performed interpolation function by interpolation function.

12 Claims, 1 Drawing Sheet

(52) U.S. Cl.
CPC ............ *E21B 43/168* (2013.01); *E21B 49/00* (2013.01); *G06F 30/20* (2020.01); *B29C 45/00* (2013.01); *B29C 66/727* (2013.01); *Y10S 220/902* (2013.01); *Y10S 507/922* (2013.01)

(56) References Cited

U.S. PATENT DOCUMENTS

| | | | | |
|---|---|---|---|---|
| 2014/0214386 | A1* | 7/2014 | Gehin | ........... E21B 47/10 703/10 |
| 2015/0337631 | A1* | 11/2015 | Matringe | ........... E21B 43/00 703/10 |

OTHER PUBLICATIONS

K. Ma, J. L. Lopez-Salinas, M. C. Puerto, C. A. Miller, S. L. Biswal, and G. J. Hirasaki, "Estimation of PArameters for the Simulation of Foam Flow through Porous Media. Part 1: the Dry-Out Effect" pp. 2363-2375, 2013, (Year: 2013).*

Ma, K., Lopez-Salinas, J.L., Puerto, M.C., Miller, C.A., Biswal, S.L., Hirasaki, G.J., 2013; "Estimation of Parameters for the Simulation of Foam Flow through Porous Media. Part 1: The Dry-Out Effect"; Energy & Fuels 27, 2363-2375 (ACS Publications); 13 pages.

Farajzadeh, R., Lotfollahi, M., Eftekhari, A.A., Rossen, W.R. and Hirasaki, G.J., 2015; "Effect of Permeability on Implicit-Texture Foam Model Parameters and the Limiting Capillary Pressure"; Energy Fuels 29, 3011-3018 (ACS Publications); 8 pages.

Kapetas, L., Vincent-Bonnieu, S., Farajzadeh, R., Eftekhari, A.A., Mohd-Shafian, S.R., Kamarul Bahrim, R.Z. and Rossen, W.R., 2015; "Effect of Permeability on Foam-Model Parameters—An Integrated Approach from Coreflood Experiments through to Foam Diversion Calculations"; 18th European Symposium on IOR, Dresden, Apr. 14-16, 2015; 16 pages.

* cited by examiner

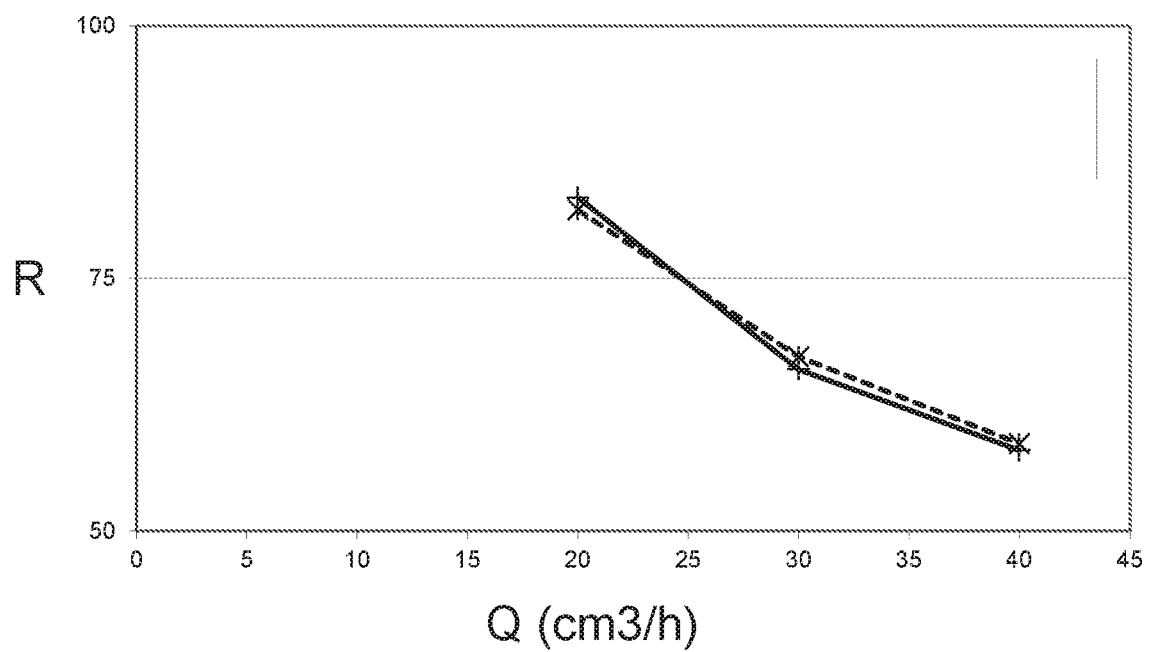

METHOD FOR OPERATING A HYDROCARBON DEPOSIT BY INJECTION OF A GAS IN FOAM FORM

CROSS REFERENCE TO RELATED APPLICATION

Reference is made to French Patent Application No. 16/57.393, filed Jul. 31, 2016, which is hereby incorporated herein by reference in its entirety for all purposes.

BACKGROUND OF THE INVENTION

Field of the Invention

The present invention relates to the operation of a fluid contained in an underground formation, and more particularly to the assisted recovery of a fluid, such as a hydrocarbon fluid, by foam injection.

Description of the Prior Art

The operation of an oil reservoir by primary recovery extracts, via a so-called production well, the oil present in the reservoir through the effect of overpressure prevailing naturally in the reservoir. This primary recovery makes possible accessing only a small quantity of the oil contained in the reservoir, around 10 to 15% at the very most.

To make it possible to continue to extract the oil, secondary production methods are employed, when the pressure of the reservoir becomes insufficient to displace the oil still in place. In particular, a fluid is injected (re-injection of the water produced, diluted or not, injection of sea or river water, or even injection of gas, for example) into the hydrocarbon reservoir, in order to exert, in the reservoir, an overpressure specifically to drive the oil to the production well or wells. One standard technique in this context is water injection (also referred to as "waterflooding"), in which large volumes of water are injected under pressure into the reservoir via injection wells. The injected water drives a part of the oil that it encounters and pushes it to one or more production producing wells. The secondary production methods such as water injection however, make possible extraction of only a relatively small part of the hydrocarbons in place (typically around 30%). This partial scavenging is due in particular to the trapping of the oil by capillary forces, to the differences in viscosity and in density that exist between the injected fluid and the hydrocarbons in place, and to heterogeneity on microscopic or macroscopic scales (scale of the pores and also scale of the reservoir).

To try to recover the rest of the oil, which remains in the underground formations after the implementation of the primary and secondary production methods, there are various so-called assisted recovery techniques (known by the acronym "EOR", which stands for "Enhanced Oil Recovery"). Among these techniques, techniques can be cited that are similar to the abovementioned water injection, but that employ water including additives such as, for example, soluble surface active agents in the water (this is called "surfactant flooding"). The use of such surface active agents induces in particular a reduction of the water/oil interfacial tension, which is specifically to ensure a more effective driving of the oil trapped in constrictions of pores.

Also known is assisted recovery by injection of gases, miscible or not (natural gas, nitrogen or $CO_2$). This technique makes possible maintaining the pressure in the oil reservoir during its operation, but can also make possible, in the case of miscible gases, mobilizing the hydrocarbons in place and thus improving the flow rate. A gas commonly used is carbon dioxide when it is available at low cost.

Also known are alternative techniques relying on an injection of foam into the oil reservoir. Because of its high apparent viscosity, the foam is considered, as an alternative to gas, an injection fluid in hydrocarbon reservoirs. The mobility of the foam is thus reduced relative to gas which, for its part, tends to segregate and perforate rapidly in the producing wells, notably in the heterogeneous and/or thick reservoirs. Assisted recovery by foam injection is particularly attractive because it requires the injection of smaller volumes than for other assisted recovery methods based on non-foaming fluids.

STATE OF THE ART

The following documents will be cited hereinbelow in the description:

Ma, K., Lopez-Salinas, J. L., Puerto, M. C., Miller, C. A., Biswal, S. L., Hirasaki, G. J., 2013. Estimation of Parameters for the Simulation of Foam Flow through Porous Media. Part 1: The Dry-Out Effect. Energy & Fuels 27, 2363-2375 (ACS Publications).

Farajzadeh, R., Lotfollahi, M., Eftekhari, A. A., Rossen, W. R. and Hirasaki, G. J., 2015. Effect of Permeability on Implicit-Texture Foam Model Parameters and the Limiting Capillary Pressure. *Energy Fuels* 29, 3011-3018 (ACS Publications).

Kapetas, L., Vincent-Bonnieu, S., Farajzadeh, R., Eftekhari, A. A., Mohd-Shafian, S. R., Kamarul Bahrim, R. Z. and Rossen, W. R., 2015. Effect of Permeability on Foam-Model Parameters—An Integrated Approach from Coreflood Experiments through to Foam Diversion Calculations. 18th European Symposium on IOR, Dresden, 14-16 April.

Oil operation of a deposit selects the areas of the deposit that exhibit the best oil potential, in defining optimal operating schemes for these areas (notably using a numerical simulation of the flows in the deposit, in order to define the type of recovery, the number and positions of the operation wells, allowing an optimal hydrocarbon recovery), in drilling operation wells and, in general, in putting in place the production infrastructures necessary to the development of the deposit.

Defining an operating scheme of an oil reservoir including a step of assisted recovery by foam injection may entail numerically simulating, in the most realistic way possible, the flows in the presence of foam in the reservoir being considered. Such a simulation is performed using a flow simulator comprising a model of displacement of the foam.

Such a model may involve evaluating the performance levels of the foam in terms of mobility reduction. In general, this estimation involves conducting laboratory trials which measure the headlosses in displacements of foam on the one hand, of water and of non-foaming gas on the other hand in a sample of the oil reservoir. Then, this model of displacement of the foam, representative of the flows on a laboratory scale, is calibrated to the scale of the reservoir before carrying out the numerical simulations of the flows, in order to predict the benefit accrued by the injection of the foam in terms of improvement of the effectiveness of displacement of the fluids in place.

The foam displacement models used by the industry are relatively simple models which, subject to the conditions of existence of the foam, simulate only the effects of the foam in terms of mobility reduction and not the foam generationdestruction processes. Generally, the foam displacement models depend nonlinearly on numerous parameters (calibration constants). Determining the parameters of this model therefore involves solving a nonlinear inverse problem. However, the complexity of the displacement of a foam in a confined environment that characterizes any natural porous medium is difficult to model because the possible great number of parameters influencing the foam can lead to indeterminacies (multiple solutions).

The approach proposed by Ma et al., 2013 simultaneously determines parameters of the foam displacement model by a graphic approach, completed by a numerical adjustment.

Also known is the technique proposed in Farajzadeh et al., 2015 which proceeds with the determination of the unknown parameters (calibration constants) of the foam displacement model by an iterative least squares approach. However, since the problem posed is nonlinear with respect to these unknowns, there is no unique solution, or in other words, the parameters thus determined are one solution out of other possible ones See for example Kapetas et al., 2015.

SUMMARY OF THE INVENTION

The method according to the invention determines, pragmatically, the parameters of the foam displacement model. Unlike the existing methods, the method according to the invention uses experimental data and proceeds with a sequential adjustment of the parameters of the foam model, and not in an overall adjustment. Thus, the method according to the invention makes it possible to minimize the numeric adjustments, by extracting the maximum of information on the dynamic behavior of foam from the experimental data.

Thus, the present invention relates to a method for operating an underground formation comprising hydrocarbons, by injecting an aqueous solution comprising a gas in foam form and a flow simulator relying on a displacement model of the gas in foam form, the displacement model being a function of an optimal mobility reduction factor of the gas and of at least one interpolation function of the optimal mobility reduction factor with the at least one interpolation function being a function of at least one parameter relating to at least one characteristic of the foam and of at least one constant, the method invention being implemented from at least one sample of the formation, measurements of conventional relative permeabilities to the gas in non-foaming form and measurements of conventional relative permeabilities to the aqueous phase, the method comprising:

A. determining the displacement model of the simulator by steps of:
  i. defining values of the at least one parameter relative to the at least one interpolation function by injection into the sample of the gas in non-foaming form and the gas in foam form according to the values of the at least one parameter relative to the function, and measuring headloss with foam and headloss without foam for each of the values of the at least one parameter relative to the at least one interpolation function;
  ii. determining from the measurements of headloss relative to the at least one interpolation function, an optimal value of the at least one parameter relative to the at least one interpolation function, the optimal value making possible maximization of a ratio between the headlosses without foam and the headlosses with foam measured for the at least one interpolation function;
  iii. determining the optimal mobility reduction factor from the measurements of headloss performed at the optimal value determined for the at least one interpolation function, from the measurements of conventional relative permeabilities to the gas in non-foaming form and from the measurements of conventional relative permeabilities to the aqueous;
  iv. calibrating the constants of the at least one interpolation function from the optimal mobility reduction factor, from the measurements of headloss relative to the interpolation function, from the measurements of conventional relative permeabilities to the gas in non-foaming form and from the measurements of conventional relative permeabilities to the aqueous phase; and
B. using the displacement model and the flow simulator to determine an optimal operational scheme for operating the formation to produce the hydrocarbons, and extracting the hydrocarbons from the formation by drilling at least one well in the formation.

According to one implementation of the invention, the displacement model of the foam can be expressed as:

$$k_{rg}^{FO}(S_g) = FM k_{rg}(S_g),$$

in which $k_{rg}^{FO}(S_g)$ is the relative permeability to the gas in foam form for a given gas saturation value $S_g$, $k_{rg}(S_g)$ is the relative permeability to the non-foaming gas for the gas saturation value $S_g$, and FM is a functional expressed as:

$$FM = \frac{1}{1 + (M^{opt} - 1) * \prod_k F_k}$$

in which $M^{opt}$ is the optimal mobility reduction factor of the gas and $F_k$ is one of the interpolation functions, with $k \geq 1$.

According to one embodiment of the invention, there can be four interpolation functions and the parameters of the functions can be a foaming agent concentration, a water saturation, an oil saturation, and a gas flow rate.

Advantageously, the interpolation function $F_k$ of a parameter $V_k$ can be written as:

$$F_k(V_k) = \frac{M_k^{opt} - 1}{M^{opt} - 1}$$

in which $M^{opt}$ is the optimal mobility reduction factor and $M_k^{opt}$ is an optimal mobility reduction factor for the parameter $V_k$.

According to one implementation of the invention, prior to the step iii), optimal conditions can be defined which corresponding to the optimal values determined for each of the interpolation functions, the gas in non-foaming form and the gas in foam form can be injected into the sample according to the optimal conditions, and a headloss with foam and a headloss without foam can be respectively measured.

Advantageously, the constants of at least one of the interpolation functions can be calibrated by a least squares method, such as an inverse method based on the iterative minimization of a functional.

Other features and advantages of the method according to the invention will become apparent on reading the following description of nonlimiting exemplary embodiments, with reference to the FIGURE attached and described hereinbelow.

BRIEF DESCRIPTION OF THE DRAWINGS

FIG. 1 illustrates an example of the trend of a mobility reduction factor R as a function of the gas flow rate Q.

DETAILED DESCRIPTION OF THE INVENTION

In general, the invention relates to a method for operating an underground formation comprising hydrocarbons, by injecting an aqueous solution comprising a gas in foam form, and in particular the determination of an optimal operating scheme for the underground formation being studied. In particular, the method according to the invention targets the determination of the parameters of a model of displacement of the gas in foam form. Hereinbelow, foam describes a phase dispersed in another phase by the addition of a foaming agent in one of the two phases. One of the phases can be water and the other phase is a gas, such as natural gas, nitrogen or $CO_2$.

The method according to the invention requires the availability of:
- a sample of the underground formation being studied, taken by in situ coring for example;
- a flow simulator relying on a model of displacement of the gas in foam form (see below);
- measurements of conventional relative permeabilities to the gas in non-foaming form and measurements of conventional relative permeabilities to the aqueous solution. These measurements can be measurements performed expressly for the requirements of the method according to the invention (knowledge of how to conduct such laboratory experiments is known), but they can also be analytical functions calibrated from known correlations.

Thus, the method according to the invention requires the availability of a flow simulator comprising a model of displacement of the foam. According to the invention, the model of displacement of the foam relies on the hypothesis that the gas present in foam form has its mobility reduced by a given factor in set conditions of formation and of flow of the foam. The formulation of such a model, used by many flow simulators, modifies the relative permeabilities to the gas when the gas is present in foam form which, for a given gas saturation $S_g$, is expressed according to a formula:

$$k_{rg}^{FO}(S_g) = FM k_{rg}(S_g) \quad (1)$$

in which $k_{rg}^{FO}(S_g)$ is the relative permeability to the gas in foam form, that is expressed as the product of a function FM by the relative permeability to the non-foaming gas $k_{rg}(S_g)$ for the same gas saturation value $S_g$ (later denoted $S_g^{FO}$). One assumption underpinning the current foam models is that the relative permeability to water (or to liquid by extension) is assumed unchanged, whether the gas is present in continuous phase form or in foam form. Given this assumption, the gas mobility reduction function, hereinafter denoted FM, is expressed according to a formula:

$$FM = \frac{1}{1 + (M_{mod}^{opt} - 1) * \prod_k F_k(V_k)} \quad (2)$$

in which:

$M_{mod}^{opt}$ is the optimal mobility reduction factor, that is the ratio of the relative permeabilities to the gas ($k_{rg}$) and to the foam ($k_{rg}^{FO}$) in optimal conditions for reducing the mobility of the gas, that is the conditions in which the terms $F_k(V_k)$ defined hereinbelow have the value 1:

$$M_{mod}^{opt} = \frac{k_{rg}(S_{g,opt}^{FO})}{k_{rg}^{FO}(S_{g,opt}^{FO})} = \frac{1}{FM_{opt}} \quad (3)$$

the terms $F_k(V_k)$ (with k equal to or greater than 1) are the values of the interpolation functions $F_k$ of the mobility reduction factor between the value $M_{mod}^{opt}$ and 1, which each depend on a parameter $V_k$ relative to at least one characteristic of the foam, and which involve calibration constants which are calibrated as explained hereinbelow.

In order to provide a model of displacement of the foam to the simulator that is representative of the reality, the method according to the invention determines, reliably from representative displacement measurements, the following modelling data:
- the optimal mobility reduction factor of the gas $M_{mod}^{opt}$ as defined according to the equation (3);
- the calibration constants of each of the functions $F_k$ considered in the definition of the model of displacement of the foam according to the equations (1) and (2).

According to one implementation of the invention, the parameter $V_k$ can notably be the foaming agent concentration $C_s^w$, the water saturation $s_w$, the oil saturation $s_o$, or even the gas flow rate $u_g$.

According to one implementation of the invention, the gas mobility reduction functional, denoted FM, comprises four interpolation functions $F_k(V_k)$ and each of these functions comprises two constants to be calibrated from experimental data. According to an implementation of the invention in which the gas mobility reduction functional comprises four interpolation functions $F_k(V_k)$, the following are defined:
the interpolation function $F_1$ relative to the parameter $V_1 = C_s^w$ (foaming agent concentration $C_s^w$) by a formula:

$$F_1 = \left( \frac{Min(C_s^w, C_s^{w-ref})}{C_s^{w-ref}} \right)^{e_s} \quad (4)$$

and for which the constants to be calibrated are the exponent $e_s$, and the constant $C_s^{w-ref}$ which corresponds to the foaming agent concentration in reference optimal conditions;
the interpolation function $F_2$ relative to the parameter $V_2 = S_w$ (water saturation), by a formula:

$$F_2 = \left[ 0.5 + \frac{\arctan[f_w(S_w - S_w^*)]}{\pi} \right] \quad (5)$$

and for which the constants to be determined are the constant $f_w$ which governs the transition (according to the water saturation) between the foaming and non-foaming states and the constant $S_w^*$ which represents the transition water saturation between stable and unstable foaming states;

the interpolation function $F_3$ relative to the parameter $V_3=s_o$ (oil saturation) by a formula of the type:

$$F_3 = \left(\frac{\text{Max}[0; S_o^* - S_o]}{S_o^*}\right)^{e_0} \quad (6)$$

in which $S_o^*$ is the oil saturation beyond which the foam loses all capability of reducing the mobility of the gas, and the exponent $e_o$ is a constant to be determined;

the interpolation function $F_4$ relative to the parameter $V_4=u_g$ (gas flow rate) by a formula of the type:

$$F_4 = \left(\frac{N_c^*}{\text{Max}(N_c, N_c^*)}\right)^{e_c} \text{ with } N_c = \frac{\mu_g u_g}{\phi \sigma_{vg}(C_s^w)} \quad (7)$$

in which $N_c^*$ is the reference value of the capillary number $N_c$ calculated for the reference optimal flow rate. The variables involved in the calculation of $N_c$ are the velocity of the gas $u_g$, the porosity $\phi$ of the formation being considered, the water-gas interfacial tension $\sigma_{gw}$ (which is dependent on the foaming agent concentration $C_s^w$), and the viscosity of the gas $\mu_g$. The exponent $e_c$ is also a constant to be calibrated.

Generally, it can be shown that any interpolation function $F_k$ of the parameter $V_k$ can be written in the form:

$$F_k(V_k) = \frac{\frac{1}{FM} - 1}{\frac{1}{FM_{opt}} - 1} = \frac{M_{mod}(V_k) - 1}{M_{mod}^{opt} - 1} \quad (8)$$

in which $M_{mod}(V_k)$ is the reduction of mobility for a value $V_k$ of the parameter k affecting the foam (and for optimal values of the other parameters $V_j$, j being different from k) and in which $M_{mod}^{opt}=M_{mod}(V_k^{opt})$ is the reduction of mobility obtained for the optimal value $V_k^{opt}$ of the parameter $V_k$. The method according to the invention thus involves, for each parameter $V_k$ affecting the foam, in determining the factors $M_{mod}(V_k)$ for various values of this parameter, and $M_{mod}^{opt}$, then determining, from these factors, the constants of the interpolation function $F_k$ being considered.

According to an implementation of the invention in which the functional FM defined in the equation (2) involves the interpolation functions $F_1$, $F_2$, $F_3$ and $F_4$ defined in the equations (4) to (7), the determination of the model of displacement of the foam entails calibrating the 8 constants: $C_s^{w-ref}$, $e_s$, $f_w$, $S_w^*$, $S_o^*$, $e_o$, $N_c^{ref}$, $e_c$.

According to the invention, the determination of the constants of the interpolation functions $F_k$ involved in the equation (2) is performed via a calibration, interpolation function by interpolation function (and not globally, for all the functions), from experimental measurements relative to each of the interpolation functions, performed in the optimal conditions established for the other interpolation functions.

The method according to the invention comprises at least the following steps with step 1 being repeated for each of the interpolation functions of the model of displacement of the foam, and step 2 being optional:

1. Laboratory measurements relative to an interpolation function
   1.1. Definition of values of the parameter relative to the interpolation function
   1.2. Injections with/without foam and measurements of headlosses
   1.3. Determination of an optimal parameter value
2. Laboratory measurements according to optimal conditions
3. Determination of the foam displacement model
   3.1. Determination of the optimal mobility reduction factor
   3.2. Calibration of the constants of the interpolation functions
4. Operation of the hydrocarbons of the formation The various steps of the method according to the invention are detailed hereinbelow.

1. Laboratory Measurements Relative to an Interpolation Function

During this step, laboratory experiments are performed relative to a given interpolation function $F_k$ of the model of displacement of the foam defined according to the equations (1) and (2). According to one implementation of the invention, this step is repeated for each of the interpolation functions involved in the model of displacement of the foam defined according to the equations (1) and (2). It should be noted that the model of displacement of the foam can however comprise only a single interpolation function (case for which k=1). Optimal values are adopted for the other parameters affecting the foam in such a way that the other interpolation functions $F_j$, different from k, have the value 1 or do not vary in these experiments relative to the interpolation function $F_k$.

During this step, applied to each interpolation function independently of one another, values of the parameter are defined relative to the interpolation function being considered, then an injection into the sample of the gas in non-foaming form and of the gas in foam form is performed according to the values of the parameter relative to the interpolation function considered, and a headloss with foam and a headloss without foam are measured respectively for each of the values of the parameter relative to this function. This step is detailed hereinbelow for a given interpolation function $F_k$.

1.1. Definition of Parameter Values Relative to the Interpolation Function

During this substep, the objective is to define values $V_{k,i}$ (with i lying between 1 and I, and I>1) of the characteristic parameter $V_k$ of the interpolation function $F_k$ being considered.

According to one implementation of the invention, the range of values of this parameter and a sampling step for this range are defined.

According to one implementation of the invention, the values of the parameter $V_k$ relative to the interpolation function $F_k$ being considered are defined from the possible or realistic values of the parameter being considered (for example, a mass concentration of foaming agent less than 1% in all cases) to sample in an ad hoc manner the curve representative of the interpolation function being considered (an interpolation function that has a linear behavior does not need a high number of measurements, unlike other types of function). Foam injection-assisted recovery uses available knowledge of how to define ad hoc values of the parameters of each of the interpolation functions $F_k$.

According to an implementation of the invention in which the interpolation function being considered relates to the fluid flow rate (parameter $V_4$ of the function $F_4$ of the equation (7)), an injection flow rate on coring of between 10 and 40 cm³/h is for example chosen, with a step of 10 cm³/h.

1.2. Injections with/without Foam and Headloss Measurements

During this substep, at least two series of experiments are carried out on at least one sample of the underground formation for the interpolation function $F_k$ being considered:

injection of gas in non-foaming form (more specifically, a co-injection of water and of gas in non-foaming form) into the sample being considered for each of the values $V_{k,i}$ of the parameter $V_k$ relative to the function $F_k$ being considered. The flow rates of gas and of water adopted for each of these co-injections are the same as the flow rates of gas and of water injected in foam form in the tests which follow these co-injections. For example, in the case of the interpolation function $F_4$ of the equation (7), the flow rate only is made to vary in the sample being considered, the parameters of the other interpolation functions $F_1$, $F_2$, $F_3$ (for example, with the foaming agent concentration, the quality of the foam and the oil saturation) being fixed. During each of the experiments of this first series, a headloss (that is to say a pressure difference) is measured, that is denoted $\Delta P_{k,i}^{NOFO}$, for each value $V_{k,i}$;

injection of foam: the same experiment is repeated, for the same values of the parameter being considered (for example the flow rate for the interpolation function $F_4$ according to the equation (7)), but by this time injecting the water and the gas in foam form. During each of the experiments of this second series, a headloss (that is to say a pressure difference) is measured, that is denoted $\Delta P_{k,i}^{FO}$ for each value $V_{k,i}$;

According to one implementation of the invention, the injections of gas in non-foaming form and in foam form are performed on samples of the formation initially saturated with a liquid phase (such as water and/or oil). The latter are able to be mobile or residual depending on the history of the coring and the measurement objectives (checking mobility of the gas in secondary or tertiary injection, after injection of water). The displacements which are studied are then draining processes in which the saturation of the gas phase increases in all cases.

According to a variant implementation of the invention, it is possible to measure, in addition to the headlosses, the production of liquid phase (water and/or oil) and of gas, and, possibly, the gas saturation profiles during the transitional period of the displacement and in the steady state. These optional measurements make possible validating the model once the interpolation functions $F_k$ are calibrated.

1.3. Determination of an Optimal Parameter Value

During this substep, the value $V_k^{opt}$ is determined, that will hereinafter be called the optimal value, maximizing the ratio between the headlosses without foam $\Delta P_{k,i}^{NOFO}$ and the headlosses with foam $\Delta P_{k,i}^{FO}$ relative to the interpolation function $F_k$ being considered and measured during the preceding substep. Thus, if $M_{lab}^{k,i}$ is used to denote the ratio of the headlosses measured in the presence and in the absence of foam for the value $V_{k,i}$ of the parameter $V_k$, that is $$M_{lab}^{k,i} = \frac{\Delta P_{k,t}^{FO}}{\Delta P_{k,i}^{NOFO}} = \frac{k_{rg}(S_{g(k,i)}^{NOFO})}{k_{rg}^{FO}(S_{g(k,i)}^{FO})},$$

it is then possible to define the optimal value $V_{k,opt}$ as the value $V_{k,i}$ which maximizes $M_{lab}^{k,i}$ whose value is then denoted as follows:

$$M_{lab}^{k,iopt} = M_{lab}^{kopt} = \max_i M_{lab}^{k,i} \qquad (9)$$

According to a preferred implementation of the invention, step 1 as described hereinabove is repeated for each of the parameters $V_k$ relative to each of the interpolation functions $F_k$ taken into consideration for the implementation of the method according to the invention. Thus, at the end of such a repetition, an optimal value $V_k^{opt}$ is obtained for each parameter $V_k$.

Subsequently, "optimal conditions" is the term used to denote the set of the values $V_k^{opt}$ determined on completion of the step 1. The latter, if necessary, is repeated for each of the interpolation functions taken into consideration for the implementation of the method according to the invention.

2. Laboratory Measurements According to Optimal Conditions

During this step, two types of experiments are performed on at least one sample of the underground formation, by injecting gas in non-foaming form, and gas in foam form, similarly to the substep 1.2. But this time in the optimal conditions determined on completion of the substep 1.3, this substep is repeated if necessary for each of the interpolation functions taken into consideration for the definition of the model of displacement of the foam according to the equations (1) and (2). In other words, the following measures are carried out:

injection of gas in non-foaming form (more specifically, a co-injection of water and of gas in non-foaming form) into the sample being considered, with this injection being performed in the optimal conditions (defined by the set of the optimal values $V_k^{opt}$ determined for each parameter $V_k$) that are determined on completion of the step 1. During this first experiment, a headloss (that is to say a pressure difference) is measured, that is then denoted $\Delta P_{opt}^{NOFO}$;

injection of foam (an injection of gas and of water, with an addition of a foaming agent into one of the water or gas phases) into the sample being considered, with this injection being performed using optimal conditions (defined by the set of the optimal values $V_k^{opt}$ determined for each parameter $V_k$) which are determined on completion of the step 1. During this second experiment, a headloss (that is to say a pressure difference) is measured, that is then denoted $\Delta P_{opt}^{FO}$.

Subsequently, $M_{lab}^{opt}$ will be used to denote the optimal mobility reduction factor relative to the laboratory measurements, defined by a formula:

$$M_{lab}^{opt} = \frac{\Delta P_{opt}^{FO}}{\Delta P_{opt}^{NOFO}} = \frac{k_{rg}(S_{g,opt}^{NOFO})}{k_{rg}^{FO}(S_{g,opt}^{FO})}. \qquad (10)$$

This step is not necessary in practice if the precaution to perform the experiments of the step 1 relative to each of the parameters $V_k$ by adopting optimal values $V_{j,j\neq k}^{opt}$ of the other parameters $V_j$ affecting the foam has indeed been taken. This step nevertheless makes it possible to refine the value of $M_{lab}^{opt}$ if the assumed optimal conditions of the parameters $V_{j,j\neq k}$ were not perfectly satisfied.

3. Determination of the Foam Displacement Model

3.1. Determination of the Optimal Mobility Reduction Factor

During this substep, the goal is, from the headloss measurements performed in the optimal conditions, from measurements of conventional relative permeabilities to the gas in non-foaming form and from measurements of conventional relative permeabilities to the aqueous phase, to determine an optimal mobility reduction factor, that is the factor of reduction of the relative permeabilities to the gas when, present at a given saturation within the porous medium, it circulates in foam form or in continuous phase form (in the presence of water).

According to one implementation of the invention, the optimal mobility reduction factor is determined according to at least the following steps:

from the conventional relative permeabilities to the gas $k_{rg}$ and to the aqueous phase $k_{rw}$, the gas saturation is calculated in steady state conditions of flow of non-foaming gas and water $s_g^{NOFO}$ according to a formula:

$$S_g^{NOFO} = \left(\frac{k_{rg}}{k_{rw}}\right)^{-1}\left(\frac{f_g}{1-f_g}\frac{\mu_g}{\mu_w}\right) \quad (11)$$

in which $f_g$ is the fractional gas flow rate (ratio of the gas flow rate to the total flow rate), $\mu_g$ and $\mu_w$ are, respectively, the viscosity of the gas and of the water;

from the ratio of headlosses measured in the optimal conditions as defined on completion of the step 1 (step 1 may be repeated if necessary for each of the interpolation functions $F_k$ being considered), from the gas saturation in steady state conditions of flow of non-foaming gas and water $S_g^{NOFO}$, and the gas saturation in the presence of foam $S_g^{FO}$ is calculated according to a formula of the type:

$$S_{g,opt}^{FO} = 1 - (k_{rw})^{-1}\left\{\frac{k_{rw}(S_w^{NOFO} = 1 - S_g^{NOFO})}{M_{lab}^{opt}}\right\} \quad (12)$$

This relationship follows from the known assumption that the functions of relative permeability to water flowing in the form of foam films or in conventional continuous form do not vary.

from the gas saturation in steady state conditions of flow of non-foaming gas and water $S_g^{NOFO}$, from the gas saturation in the presence of foam $S_{g,opt}^{FO}$ in the optimal conditions, from the factor $M_{lab}^{opt}$ determined in the optimal conditions (see step 2), the mobility reduction factor $M_{mod}^{opt}$ is determined according to a formula:

$$M_{mod}^{opt} = M_{lab}^{opt}\frac{k_{rg}(S_{g,opt}^{FO})}{k_{rg}(S_{g,opt}^{NOFO})} \quad (13)$$

3.2. Calibration of the Constants of the Interpolation Functions

During this substep, the constants of each of the interpolation functions $F_k$ being considered are calibrated, from the optimal mobility reduction factor $M_{mod}^{opt}$, from the headloss measurements relative to the interpolation function considered, from the measurements of conventional relative permeabilities to the gas in non-foaming form and from the measurements of conventional relative permeabilities to the aqueous phase.

According to one implementation of the invention, the procedure described in the substep 3.1 is applied beforehand to the ratios of the headlosses $M_{lab}^{k,i}$ measured in the presence and in the absence of foam for the different values $V_{k,i}$ of the parameter $V_k$. Thus, the mobility reduction factors $M_{mod}^{k,i}$ relative to the values $V_{k,i}$ of the parameter $V_k$ are determined according to a formula:

$$M_{mod}^{k,i} = M_{lab}^{k,i}\frac{k_{rg}(S_{g,(k,i)}^{FO})}{k_{rg}(S_{g,(k,i)}^{NOFO})}, \quad (14)$$

in which the gas saturation in the presence of foam $S_{g,(k,i)}^{FO}$ for the values $V_{k,i}$ of the parameter $V_k$ is obtained according to a formula:

$$S_{g,(k,i)}^{FO} = 1 - (k_{rw})^{-1}\left\{\frac{k_{rw}(S_{w(k,i)}^{NOFO} = 1 - S_{g,(k,i)}^{NOFO})}{M_{lab}^{k,i}}\right\} \quad (15)$$

Advantageously, this operation is repeated for each of the interpolation functions $F_k$. Then, the constants of each of the interpolation functions $F_k$ being considered are calibrated, from the optimal mobility reduction factor $M_{mod}^{opt}$ and from the values of the mobility reduction factors $M_{mod}^{k,i}$ relative to each interpolation function determined as described above. In the case of the function $F_4$ for example, a value of the exponent $e_c$ is determined which most closely adjusts the values of $M_{mod}^{4,i}$ corresponding to the values $V_{4,i}$ of the parameter studied (flow rate in this example), which is formulated as follows:

$$F_4(V_{4,i}) = \left(\frac{N_c^*}{\text{Max}(N_{c,i}, N_c^*)}\right)^{e_c} = \frac{M_{mod}^{4,i} - 1}{M_{mod}^{opt} - 1}$$

According to one implementation of the invention, this calibration, interpolation function by interpolation function, can be performed by a least squares method, such as for example an inverse method based on the iterative minimization of a functional. These methods are known. Advantageously, the implementation of a least squares method and in particular the iterative minimization of a functional, is performed by use of a computer.

According to another implementation of the invention, such a calibration is graphically carried out, interpolation function by interpolation function. Knowledge of such methods for calibrating constants of a function from a series of values of the function is known.

Thus, on completion of this step, there is a model of displacement of the foam that is calibrated and suitable for use by an ad hoc flow simulator.

4. Operation of the Hydrocarbons

During this step, the at least an optimal scheme for operating the fluid contained in the formation is defined by, an operating scheme that allows for an optimal operation of a fluid considered according to technical and economic criteria predefined by those working in the field. It can be a scenario offering a high rate of recovery of the fluid, over a long period of operation, and requiring a limited number of wells. Then, according to the invention, the fluid of the formation being studied is operated according to this optimal operation scheme.

According to the invention, the determination of the operational scheme is performed using a flow simulation that makes use of the foam displacement model established during the preceding steps. One example of flow simulator that makes it possible to take account of a foam displacement model is the PumaFlow software (IFP Energies nouvelles, France).

According to the invention, at any instant t of the simulation, the flow simulator solves all the flow equations specific to each mesh and delivers solution values of the unknowns (saturations, pressures, concentrations, temperature, etc.) predicted at that instant t. The knowledge of the quantities of oil produced and of the state of the deposit (distribution of the pressures, saturations, etc.) at the instant being considered results from this resolution. According to one implementation of the invention, different schemes for operating the fluid of the formation being studied are defined. The flow simulator incorporating the foam displacement model determined on completion of the step 3 is used to estimate the quantity of hydrocarbons produced according to each of the different operating schemes.

An operating scheme relative to a foam injection-assisted recovery can notably be defined by at least one of a type of gas injected into the formation being studied, the type of foaming agent added to this gas, and by the quantity of foaming agent, etc. An operating scheme is also defined by a number, a geometry and a layout (position and spacing) of the injecting and producing wells in order to best account for the impact of the fractures on the progression of the fluids in the reservoir. In order to define an optimal operating scheme, various tests of different production scenarios can be performed using a flow simulator. The operating scheme that offers the best fluid recovery rate for the lowest cost will for example be preferred. By selecting various scenarios, characterized for example by various respective layouts of the injecting and producing wells, and by simulating the fluid production for each of them, it is possible to select the scenario that makes it possible to optimize the production of the formation considered according to the technical and economic criteria predefined by the expert. The operating scheme offering the best fluid recovery rate for the lowest cost will for example be considered as the optimal operating scheme.

Then the formation is operated according to the scenario that makes it possible to optimize the production from the deposit, notably by drilling injecting and producing wells defined by the optimal operating scheme, and to produce the fluid according to the recovery method defined by the optimal operating scheme.

Production Example

The features and advantages of the method according to the invention will become more clearly apparent on reading about the following exemplary application.

More specifically, the present invention has been applied to an underground formation in which the reservoir rock is sandstone, of the Berea sandstone type. An assisted recovery of the hydrocarbons contained in the reservoir based on an injection of foaming $CO_2$ is tried.

For this example, a functional FM of the foam displacement model is used according to the equation (2) defined by the four interpolation functions according to the equations (4) to (7). As prescribed in the method according to the invention, the calibration of the constants of the interpolation functions is carried out interpolation function by interpolation function. Only the calibration of the interpolation function $F_4$ (see equation (7)) is detailed hereinbelow, but the same principle can be applied to the other interpolation functions.

According to the step 1.2 described above, a series of co-injections of gas and of water and of injections of foam were carried out in the laboratory, on a sample of the reservoir rock originating from the formation being studied. The characteristics of this sample and the measurement conditions are presented in Table 1. A non-dense gaseous mixture having 62% $CO_2$ and 38% methane at a temperature of 100° C. and a pressure of 100 bar was injected. These displacements were performed with fixed fractional gas flow rate (equal to 0.8) and for different successive total flow rates (10, 20, 30 and 40 cm³/h). The oil is absent for this series of tests and the headlosses in steady state conditions of flow of water and of gas on the one hand, of foam on the other hand, were measured in the same conditions.

The conventional known relative permeabilities required to resolve the equations (11) and (12) are analytical functions defined as power functions (called Corey functions) with exponents equal to approximately 2.5 for the gas and 3.9 for the water with an irreducible drainage water saturation equal to 0.15, and limit points equal to 0.2 for the gas and 1 for the water, i.e.:

$$k_{rg}(S_g^{NOFO}) = 0.2\left(\frac{S_g^{NOFO}}{0.85}\right)^{2.5}$$

$$k_{rw}(S_w^{NOFO}) = \left(\frac{S_w^{NOFO} - 0.15}{0.85}\right)^{3.9}$$

These curves of relative permeabilities were estimated beforehand from literature data and checked afterwards by comparison of the headloss values calculated and measured during the co-injections of gas and of water. In this way the model of relative permeability to the foam does indeed return the gas mobility reductions that is the ratios of relative permeability in the absence and in the presence of foam, but without necessarily the well reproducing the real diphasic behavior (transient states in particular).

Table 1 presents the headlosses (pressure gradient) with and without foam for four values of the parameter $V_4 = u_g$ of the equation (7). From these values, the value of $$M_{lab}^{kopt} = \max_i M_{lab}^{k,i}$$

is deduced therefrom. This value ($M_{lab}^{4opt}$ in this example), equal to 83, was obtained for a flow rate $V_4^{opt}$ equal to 20 cm³/h (see substep 1.3). These laboratory experiments were repeated for the other parameters of the other interpolation functions $F_1$, $F_2$, and $F_3$. The optimal conditions are then determined for all of the interpolation functions.

According to step 2, measurements are performed with and without foam for the duly determined optimal conditions. The optimal mobility reduction factor $M_{mod}^{opt}$ is then determined, in accordance with the step 3.1 and values of the mobility reduction factors $M_{mod}^{k,i}$ are determined relative to the sampled values $V_{k,i}$ of the parameter $V_k$, in accordance with the step 3.2. The calibration of each of the interpolation functions is then carried out. In particular with the constant $e_c$ of the function $F_4$ being calibrated and a value close to 0.6 being determined.

FIG. 1 shows by a solid line the trend of the mobility reduction factor R as a function of the parameter $V_4$ of the function $F_4$ (flow rate Q) deduced from the method according to the invention. The comparison with the mobility reduction factor deriving from the flow simulation (dotted line curve) shows a good consistency with the foam displacement model of according to the invention.

Thus, the method according to the invention provides a reliable determination of the foam displacement model from experimental data produced and processed according to a sequential and systematic approach, parameter by parameter without the overall adjustment of a set of measurements varying one or more parameters simultaneously. Moreover, given the parametric complexity of the behavior of the foams, the experiments according to the method according to the invention are carried out in conditions as close as possible to the reservoir conditions.

TABLE 1

| Berea sandstone | | | | | | |
|---|---|---|---|---|---|---|
| P = 100 bar | Total flow rate [cm3/h] | 10 | 20 | 30 | 40 |
| T = 100° C. | $\Delta P_{k,i}^{FO}$ | 5.2 | 10.3 | 11.9 | 13.6 |
| L = 15 cm | $\Delta P_{k,i}^{NOFO}$ | 0.07 | 0.124 | 0.18 | 0.235 |
| A = 12.56 cm2 | | | | | |
| φ = 0.19 | | | | | |
| Kw = 120 mD | | | | | |
| μw = 0.28 cp | | | | | |
| μg = 0.02 cp | | | | | |
| ρg = 0.125 g/cm3 | $M_{lab}^{k,i} = \dfrac{\Delta P_{k,i}^{NOFO}}{\Delta P_{k,i}^{FO}}$ | 74 | 83 | 66 | 58 |

The invention claimed is:

1. A method for operating an underground formation to produce the hydrocarbons from the formation by drilling at least one well in the formation, injecting an aqueous solution comprising a gas in foam form and using a flow simulator based on a displacement model of the gas in foam form, the displacement model of the gas in foam form being a function of an optimal mobility reduction factor of the gas and of at least one interpolation function of the optimal mobility reduction factor, the at least one interpolation function of the optimal mobility reduction factor being a function of at least one parameter relating to at least one characteristic of the sample of the formation of relative permeabilities to the gas in non-foaming form and of relative permeabilities to the aqueous solution, the method comprising:

A. determining the displacement model of the simulator according to steps of:
   i). defining values of the at least one parameter relative to at least one of the interpolation functions, injecting the gas in non-foaming form and injecting the gas in foaming form into the at least one sample according to values of the at least one parameter relative to the at least one interpolation function of the optimum mobility reduction factor of the gas, and measuring headloss with foam and headloss without foam for each of the values of the at least one parameter relative to the at least one interpolation function;
   ii). determining from the measurements of headloss relative to the at least one interpolation function an optimal value of the at least one parameter relative to the at least one of the interpolation function, the optimal value enabling maximizing a ratio between the headloss without foam and the headloss with foam measured for the at least one interpolation function;
   iii). defining optimal conditions corresponding to the optimal values determined for each of the at least one interpolation functions, injecting the gas in non-foaming form and the gas in foam form into the sample according to the optimal conditions, and measuring a headloss with foam and a headloss without form respectively performed for the optimal conditions;
   iv). determining the optimal mobility reduction factor from the measurements of headloss performed with the optimal value determined for the at least one interpolation function from the measurements of relative permeabilities to the gas in non-foaming form and from measurements of relative permeabilities of the aqueous solution; and
   v). calibrating the constants for the at least interpolation function from the optimal mobility reduction factor, the measurements of headloss relative to the at least one interpolation function, and from the measurements of relative permeabilities of the gas in non-foaming form and from the measurements of relative permeabilities to the aqueous solution; and B. determining an optimum operational scheme for the formation by using the displacement model and the flow simulator and extracting the hydrocarbons from the at least one well in the formation located with the operational scheme.

2. The method according to claim 1, wherein the displacement model of the foam is expressed as:

$$k_{rg}^{FO}(S_g) = FM k_{rg}(S_g)$$

wherein $k_{rg}^{FO}(S_g)$ is relative permeability to the gas in foam form for a given gas saturation value Sg, $k_{rg}(S_g)$ is relative permeability to the non-foaming gas for the gas saturation value Sg, and FM is a function expressed as:

$$FM = \frac{1}{1 + (M^{opt} - 1) * \prod_k F_k}$$

wherein $M^{opt}$ is the optimal mobility reduction factor of the gas and $F_k$ is one of the interpolation functions, with k≥1.

3. The method according to claim 1, wherein there are four interpolation functions and the parameters of the four interpolation functions are foaming agent concentration, water saturation, oil saturation and gas flow rate.

4. The method according to claim 2, wherein there are four interpolation functions and the parameters of the four interpolation functions are a foaming agent concentration, water saturation, oil saturation and gas flow rate.

5. The method according to claim 1, wherein the interpolation function $F_k$ of a parameter $V_k$ is written as:

$$F_k(V_k) = \frac{M_k^{opt} - 1}{M^{opt} - 1}$$

wherein $M^{opt}$ is the optimal mobility reduction factor and $M_k^{opt}$ is an optimal mobility reduction factor for the parameter $V_k$.

6. The method according to claim 2, wherein the interpolation function $F_k$ of a parameter $V_k$ is written as:

$$F_k(V_k) = \frac{M_k^{opt} - 1}{M^{opt} - 1}$$

wherein $M^{opt}$ is the optimal mobility reduction factor and $M_k^{opt}$ is an optimal mobility reduction factor for the parameter $V_k$.

7. The method according to claim 3, wherein the interpolation function $F_k$ of a parameter $V_k$ is written as:

$$F_k(V_k) = \frac{M_k^{opt} - 1}{M^{opt} - 1}$$

wherein $M^{opt}$ is the optimal mobility reduction factor and $M_k^{opt}$ is an optimal mobility reduction factor for the parameter $V_k$.

8. The method according to claim 4, wherein the interpolation function $F_k$ of a parameter $V_k$ is written as:

$$F_k(V_k) = \frac{M_k^{opt} - 1}{M^{opt} - 1}$$

wherein $M^{opt}$ is the optimal mobility reduction factor and $M_k^{opt}$ is an optimal mobility reduction factor for the parameter $V_k$.

9. The method according to claim 1, wherein the constants of at least one of the interpolation functions are calibrated by at least squares method, based on an iterative minimization of a function.

10. The method according to claim 2, wherein the constants of at least one of the interpolation functions are calibrated by at least squares method, based on an iterative minimization of a function.

11. The method according to claim 3, wherein the constants of at least one of the interpolation functions are calibrated by at least squares method, based on an iterative minimization of a function.

12. The method according to claim 4, wherein the constants of at least one of the interpolation functions are calibrated by at least squares method, based on an iterative minimization of a function.

* * * * *